United States Patent [19]
Rieger

[11] Patent Number: 5,783,962
[45] Date of Patent: Jul. 21, 1998

[54] BOOTSTRAP CIRCUIT AND INTEGRATED MEMORY CIRCUIT HAVING THE BOOTSTRAP CIRCUIT

[75] Inventor: Johann Rieger, Zell, Germany

[73] Assignee: Siemens Aktiengesellschaft, Munich, Germany

[21] Appl. No.: 679,372

[22] Filed: Jul. 8, 1996

[30] Foreign Application Priority Data

Jul. 6, 1995 [DE] Germany ............... 195 24 658.6

[51] Int. Cl.$^6$ ............................... H03K 17/16
[52] U.S. Cl. ............... 327/390; 327/383; 327/427; 327/434; 327/589
[58] Field of Search ............... 327/383, 389, 327/390, 427, 434, 589

[56] References Cited

U.S. PATENT DOCUMENTS

| | | | |
|---|---|---|---|
| 5,548,238 | 8/1996 | Zhang et al. | 327/434 |
| 5,621,348 | 4/1997 | Furutani et al. | 327/390 |

OTHER PUBLICATIONS

Digital Circuits by William J. Streib, 1990, pp. 272–275.

*Primary Examiner*—Timothy P. Callahan
*Assistant Examiner*—Jung Ho Kim
*Attorney, Agent, or Firm*—Herbert L. Lerner; Laurence A. Greenberg

[57] ABSTRACT

A bootstrap circuit includes a transfer transistor and a driver transistor of the same channel type each having two channel terminals and a gate. A first signal terminal receives a first signal and a second signal terminal receives a second signal. One of the channel terminals of the transfer transistor is connected to the gate of the driver transistor. The other of the channel terminals of the transfer transistor is connected to the first signal terminal. One of the channel terminals of the driver transistor is connected to the second signal terminal. The other of the channel terminals of the driver transistor forms an output of the bootstrap circuit. A configuration generates a third signal and has an output connected to the gate of the transfer transistor. The second signal has an edge extending from a first level to a second level and beginning at a bootstrap time. The first signal has a precharging level between the first level and the second level of the second signal occurring no later than another time being at the latest equal to the bootstrap time. After the other time, the third signal has a first level being equal to or located on the other side of the level of the first signal as seen from the second level of the second signal. Before the other time, the third signal has a second level being on the same side of the precharging level of the first signal as seen from the second level of the second signal.

5 Claims, 4 Drawing Sheets

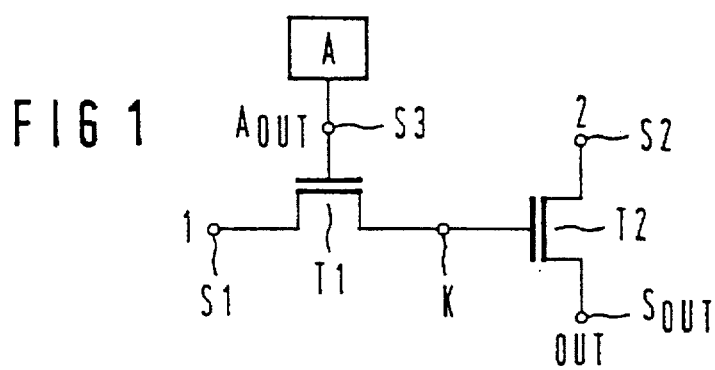
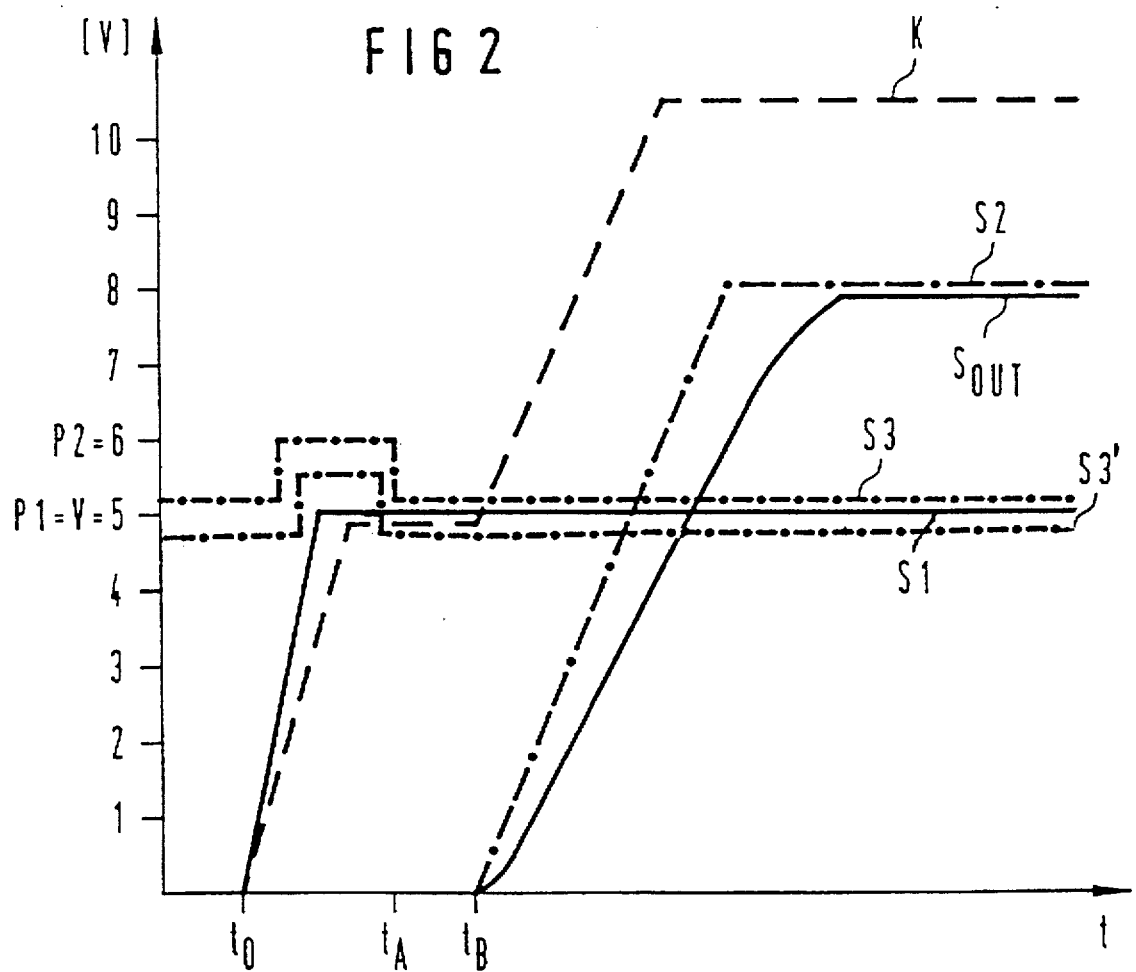

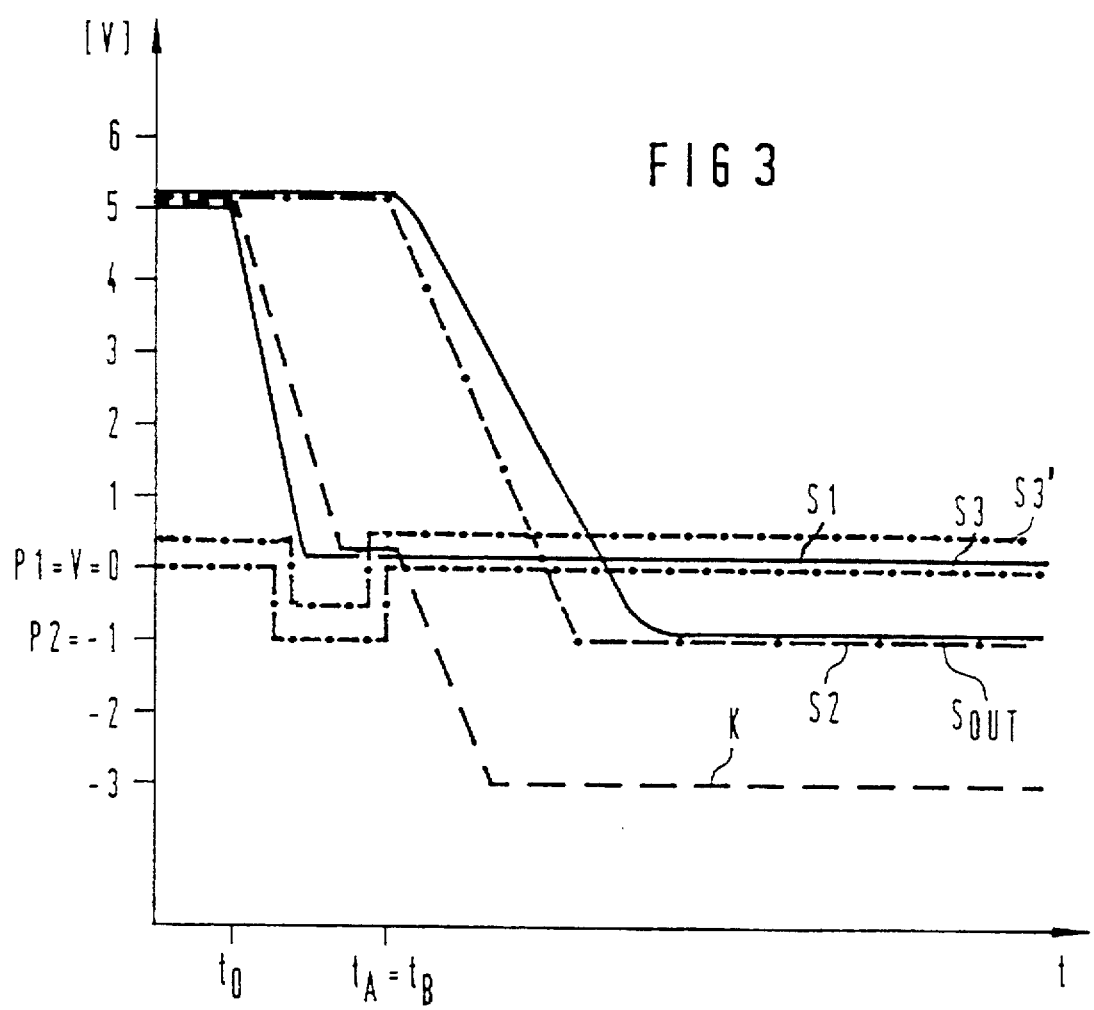

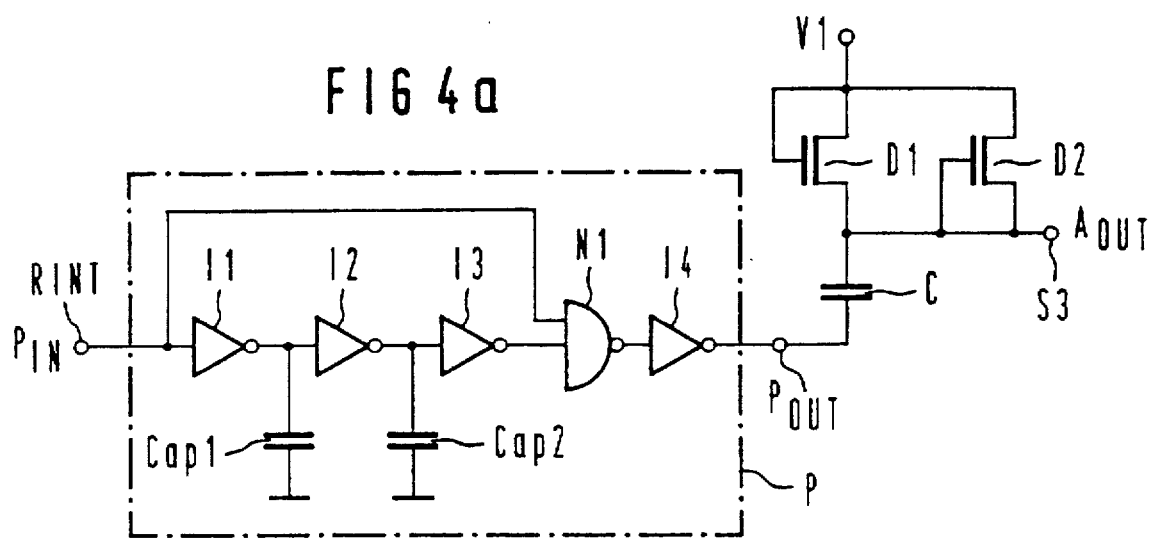
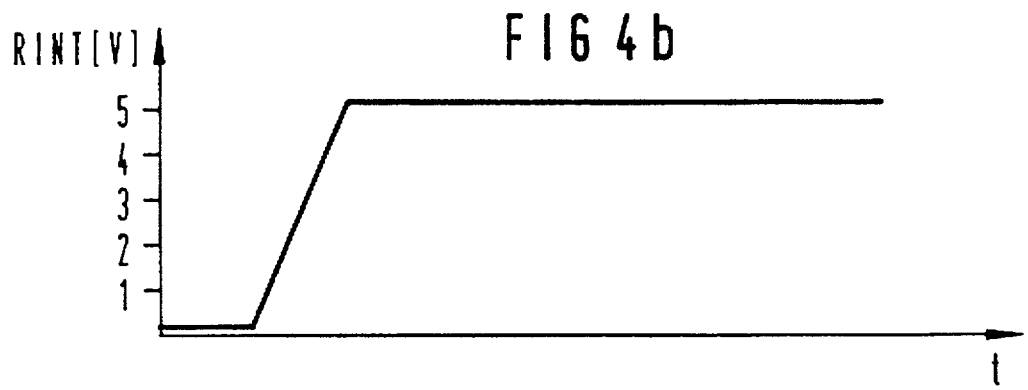
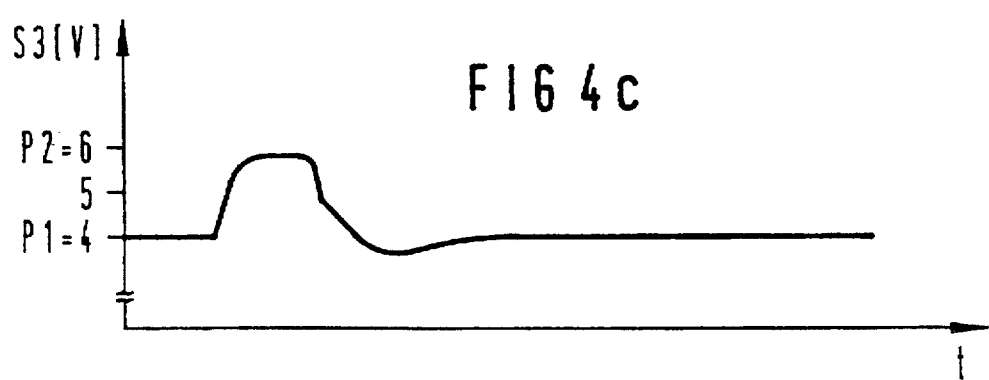

BOOTSTRAP CIRCUIT AND INTEGRATED MEMORY CIRCUIT HAVING THE BOOTSTRAP CIRCUIT

BACKGROUND OF THE INVENTION

Field of the Invention

The invention relates to a bootstrap circuit and an integrated memory circuit having the bootstrap circuit.

Already known bootstrap circuits include a transfer transistor having one channel terminal connected to a gate of a driver transistor of the same channel type. Those circuits are used, for instance, in dynamic memories (DRAMs) for switching boosted word line voltages. For that purpose, if the transfer transistor and the driver transistor are of the n-channel type, the gate of the transfer transistor is connected to a positive supply potential. A signal which has a positive edge from 0 V to a boosted voltage level that is higher than the supply potential at the gate of the transfer transistor can then be applied to one channel terminal of the driver transistor and can be switched-through, through the driver transistor, to its other channel terminal, which forms the output of the bootstrap circuit. To that end, a signal with a positive edge from 0 V to the value of the supply potential is applied to the other channel terminal of the transfer transistor. That edge arrives before the edge of the boosted signal applied to the driver transistor. The gate of the driver transistor is then in fact precharged through the transfer transistor to the value of the supply potential minus the inception voltage of the transfer transistor. If the positive edge of the boosted signal then follows, the potential at the gate of the driver transistor rises because of the capacitive coupling to the boosted signal, and thus its level is always above the level of the boosted signal. As a consequence, the transfer transistor blocks, and the driver transistor switches the full level of the boosted signal through to the output of the bootstrap circuit.

SUMMARY OF THE INVENTION

It is accordingly an object of the invention to provide a bootstrap circuit, which overcomes the hereinafore-mentioned disadvantages of the heretofore-known devices of this general type and with which faster switching-through of a signal at a driver transistor is possible.

With the foregoing and other objects in view there is provided, in accordance with the invention, a bootstrap circuit, comprising a transfer transistor and a driver transistor of the same channel type each having two channel terminals and a gate; a first signal terminal for receiving a first signal and a second signal terminal for receiving a second signal; one of the channel terminals of the transfer transistor being connected to the gate of the driver transistor; the other of the channel terminals of the transfer transistor being connected to the first signal terminal; one of the channel terminals of the driver transistor being connected to the second signal terminal; the other of the channel terminals of the driver transistor forming an output of the bootstrap circuit; and a configuration generating a third signal and having an output connected to the gate of the transfer transistor; the second signal having an edge extending from a first level to a second level and beginning at a bootstrap time; the first signal having a precharging level being between the first level and the second level of the second signal and being no later than another time being at the latest equal to the bootstrap time; after the other time, the third signal having a first level being equal to or located on the far or other side of the level of the first signal as compared with the second level of the second signal; and before the other time, the third signal having a second level being on this or the same side of the precharging level of the first signal as compared with the second level of the second signal.

The invention offers the advantage of precharging the gate of the driver transistor to a potential which does not, as in the prior art, differ from the precharging level of the first signal by the value of the inception voltage of the transfer transistor. In the prior art, a potential having the value of the precharging level of the first signal, which is equal to a supply potential, is always present at the gate of the transfer transistor. Instead, it has a lesser difference as compared with the precharging level. This difference is dependent on the amount by which the level of the third signal, relative to the second level of the second signal, is located on this side of the precharging level of the first signal.

In accordance with another feature of the invention, it is optimal if this difference is at least equivalent to the value of the inception voltage of the transfer transistor. Then in fact the precharging level of the first signal is switched entirely through by the transfer transistor, and the gate of the driver transistor is correspondingly precharged. The advantageous result is a greater opening of the driver transistor, since the amount of its gate-to-source voltage is increased as compared with the prior art. Thus the second level of the second signal is switched through faster to the output of the bootstrap circuit. Consequently, there is a speed advantage to the bootstrap circuit of the invention, as compared with the prior art.

In accordance with a further feature of the invention, the third signal is a pulsed signal.

In accordance with an added feature of the invention, the first signal has a given edge before reaching the precharging level; and before the given edge the third signal is located on this side of the precharging level of the first signal, as compared with the second level of the second signal.

In accordance with an additional feature of the invention, the configuration includes a pulse generator having an input for receiving a control signal and an output; and a capacitor having a first electrode to be precharged to the first level of the third signal, the first electrode being connected to the output of the configuration, and the capacitor having a second electrode connected to the output of the pulse generator; the pulse generator receiving an edge of the control signal and generating a potential change at the output of the pulse generator from a first potential value to a second potential value and back to the first potential value, causing a potential shift to occur at the first electrode of the capacitor from the first level of the third signal to the second level of the third signal and back to the first level of the third signal.

In accordance with yet another feature of the invention, there is provided a supply potential terminal, and a first diode connected between the supply potential terminal and the first electrode of the capacitor, for precharging to the first level of the third signal.

In accordance with yet a further feature of the invention, there is provided a second diode being connected between the first electrode of the capacitor and the supply potential terminal and being connected antiparallel to the first diode, for limiting the second level of the third signal.

In accordance with yet an added feature of the invention, there is provided a supply potential terminal; and a switching transistor having a channel path connected between the first electrode of the capacitor and the supply potential terminal for precharging to the first level of the third signal;

the switching transistor blocking substantially simultaneously upon application of the second potential value to the output of the pulse generator; and the switching transistor being opened again after a change back to the first potential value at the output of the pulse generator, plus a further delay.

With the objects of the invention in view there is also provided an integrated memory circuit comprising the bootstrap circuit, wherein the first signal is a word line decoder output signal and the second signal is a boosted word line voltage.

In accordance with a concomitant feature of the invention, the control signal is an internal row address strobe signal to be derived from a row address strobe signal to be applied externally to the integrated circuit.

Another advantage of the invention is that alternatively while maintaining the same switching speed for the second level of the second signal, the driver transistor can be smaller in dimension (smaller channel width), permitting a notable savings in surface area for the embodiment of the bootstrap circuit.

If the amount of the gate-to-source voltage of the driver transistor is raised from 2 V to 3 V (=2 V+the assumed inception voltage of the transfer transistor of 1 V), then by calculation, using the simplified model of a longitudinal channel approximation:

$$I_{Drain} = \text{Const} \cdot (U_{GS} - U_T)^2,$$

and the result is a current intensity $I_{Drain}$ through the driver transistor that is greater by a factor of 4, and therefore four times the switching speed. Alternatively in this case, if the switching speed is the same or the current intensity $I_{Drain}$ is the same, the channel width can be reduced by ¾. For actual practice, a factor of 2 can be considered realistic.

The invention is especially suitable for use in word line drivers of dynamic memories (DRAMs).

Other features which are considered as characteristic for the invention are set forth in the appended claims.

Although the invention is illustrated and described herein as embodied in a bootstrap circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic circuit diagram of a bootstrap circuit of the invention;

FIG. 2 is a diagram showing a course of signals indicated in FIG. 1;

FIG. 3 is a diagram showing a course of the signals shown in FIG. 1, for a case in which a transfer transistor and a driver transistor are of the p-channel type; and FIGS. 4a–c and 5a–c each show circuit diagrams and associated signal courses for one exemplary embodiment of a portion of FIG. 1.

DESCRIPTION OF THE PREFERRED EMBODIMENTS

Figure 5A:
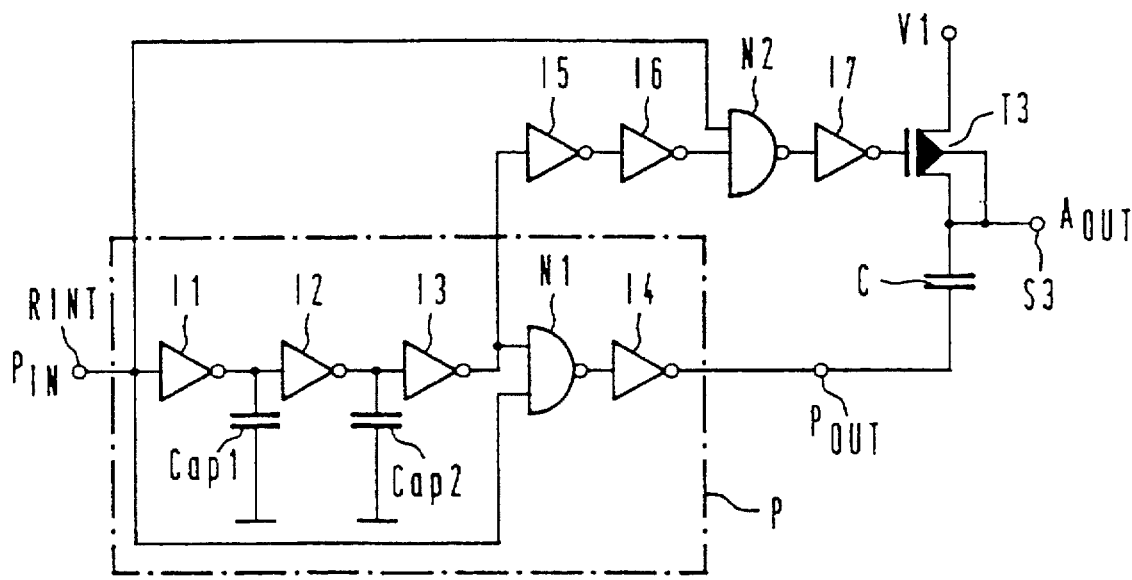

Referring now to the figures of the drawings in detail and first, particularly, to FIG. 1 thereof, there is seen a bootstrap circuit of the invention having a transfer transistor T1 and a driver transistor T2, both of the n-channel type. In other versions of the invention these two transistors T1, T2 may also be of the p-channel type. One channel terminal of the transfer transistor T1 is connected to a gate of the driver transistor T2. The other channel terminal of the transfer transistor T1 is connected to a first signal terminal 1, to which a first signal S1 can be applied. One channel terminal of the driver transistor T2 is connected to a second signal terminal 2, to which a second signal S2 can be applied. The other channel terminal of the driver transistor T2 forms an output OUT of the bootstrap circuit, at which an output signal $S_{OUT}$ forms. A gate of the transfer transistor T1 is connected to an output $A_{OUT}$ of a configuration A that serves to generate a third signal S3. A gate signal K forms at the gate of the driver transistor T2.

The function of the bootstrap circuit will be described below in terms of signal courses shown in FIG. 2 for one exemplary embodiment of the invention.

Beginning all the way to the left on the time axis, before a first time $t_0$, all of the signals in this exemplary embodiment have a level of 0 V except for the third signal S3, which has a first level P1 of 5 V. For this exemplary embodiment, it is assumed that 5 V is the value of a supply potential of an integrated circuit of which the bootstrap circuit is a component. At the time $t_0$, a positive edge of the first signal S1 begins and rises to a precharging level V having the value of the supply potential of 5 V. Approximately at the same time, the third signal S3 also has a positive edge up to a second level P2 having a value of 6 V. This potential change by 1 V is assumed to be at least equal to an inception voltage of the transfer transistor T1. The high level of the gate signal K is therefore equivalent to the precharging level V of the first signal S1, which in this exemplary embodiment is equal to its high level. The courses of the signals S1 and S3 are intended to coincide but are shown separate for the sake of clarity.

As a consequence, the level of the gate signal K likewise rises to 5 V. At a second time $t_A$, the third signal S3 drops with a negative edge back to its first level P1 of 5 V. After this second time $t_A$, the third signal S3 remains at the value of 5 V. It is important that its level accordingly no longer rises above that of the precharging level V of the first signal S1. It is only then that it is assured that the transfer transistor T1 blocks for the gate signal K which has a level at the second time $t_A$ that is equal to the precharging level V. At a bootstrap time $t_B$, a positive edge of the second signal S2 follows up to a boosted voltage of 8 V. Due to the capacitive gate-to-source voltage of the driver transistor T2 and the blocking of the transfer transistor T1 that has already taken place, the gate signal K rises parallel to the second signal S2 to a value of approximately 9.5 V. Since the gate-to-source voltage of the driver transistor T2 is greater than in the prior art and is equivalent to a difference in potentials of the gate signal K and the second signal S2, faster switching-through of the latter signal occurs, so that at the output OUT of the bootstrap circuit, the output signal $S_{OUT}$ has a rapid rise to the value of the second signal S2 (8 V). As a further example, a signal course S3' is shown which is on the far side of the signal S1, as seen from the signal S2.

FIG. 3 shows the signal courses for the case in which the transfer transistor T1 and the driver transistor T2 of FIG. 1 are not n-channel transistors but instead are p-channel transistors. For this exemplary embodiment it is assumed that before a time $t_0$ the third signal S3 has the first level P1 with a value of 0 V, while all of the other signals S1, S2, K, $S_{OUT}$ have a value of 5 V.

At the time $t_0$, a negative edge of the first signal S1 follows to a value of 0 V, which in this exemplary embodiment is its precharging level V. The levels 0 V and 5 V may, for instance, be the value of supply potentials of the integrated circuit of which the bootstrap circuit is a component. Approximately simultaneously with the negative edge of the first signal S1, the third signal S3 also has a negative edge leading to its second level P2 which is a value of -1 V. The courses of the signals S1 and S3 are intended to coincide but are shown separate for the sake of clarity. Once again it is assumed that this change in potential by 1 V is at least equal to the inception voltage of the transfer transistor T1. As a result, in this exemplary embodiment as well, the precharging level V of the first signal S1 of 0 V is switched entirely through to the gate of the driver transistor T2 (see the gate signal K). At the second time $t_A$, which in this exemplary embodiment is the same as the bootstrap time $t_B$, a positive edge of the third signal S3 back to its first level P1 follows, so that the transfer transistor T1 blocks. Simultaneously, the second signal S2 has a negative edge leading to a value of -1 V, which as in the exemplary embodiment of FIG. 2 is located outside the potential range of supply potentials of 0 V and 5 V. A negative edge results for the gate signal K and as the level of the second signal S2 drops, it becomes more and more negative.

The output signal $S_{OUT}$ again follows the course of the second signal S2 faster than is the case in the prior art, because of the greater amount of the gate-to-source voltage of the driver transistor T2.

The potential values stated herein are merely examples. In other embodiments of the invention, the course of the signals may differ from those shown in FIGS. 2 and 3. For example, all of the signals may each have more than the two illustrated potential levels. The third signal S3 in FIG. 2 may have a first level P1 of 0 V instead of the 5 V shown. Moreover, its first edge, in both exemplary embodiments, may come earlier or later than that of the first signal S1. If it comes later, a flatter edge steepness results for the gate signal K, so that the precharging of the gate of the driver transistor T2 does not occur as fast as possible. During the precharging of the gate of the driver transistor T2, the more that the level of the third signal S3 differs from that of the first signal S1, the faster the gate signal K follows the first signal S1. As a further example, a signal course S3' is shown which is on the far side of the signal S1, as seen from the signal S2.

FIG. 4a shows an exemplary embodiment of the configuration A for generating the third signal S3 of FIG. 1 if the transfer transistor T1 and the driver transistor T2 are of the n-channel type and the third signal S3 is intended to have a pulsed form as in FIG. 2. A first electrode of a capacitor C is connected to the output $A_{OUT}$ of the configuration A. A second electrode of the capacitor C is connected to an output $P_{OUT}$ of a pulse generator P, to which a control signal RINT can be supplied through one input $P_{IN}$. This input $P_{IN}$ is connected through a first inverter I1, a second inverter I2, a third inverter I3, one input of a first NAND gate N1 and a fourth inverter I4 to the output $P_{OUT}$. This input $P_{IN}$ is also connected to another input of the first NAND gate N1. Inputs of the second inverter I2 and the third inverter I3 are each connected to ground through a respective delay capacitor Cap1, Cap2.

The first electrode of the capacitor C is connected through an n-channel transistor that is connected as a first diode D1, to a supply potential terminal V1 of the integrated circuit. A positive supply potential of 5 V can be applied to the supply potential terminal V1. The diode D1 is disposed in the flow direction between the supply potential terminal V1 and the first electrode of the capacitor C, so that it can be precharged virtually to the value of the corresponding supply potential. A second diode D2, that is likewise constructed as an n-channel transistor, is disposed antiparallel to the first diode D1.

The control signal RINT which can be applied to the input $P_{IN}$ of the pulse generator P may, for example, have a course shown in FIG. 4b. Initially, the control signal RINT has a value of 0 V. Accordingly, the resultant value at the output $A_{OUT}$ of the configuration A for the first level P1 of the third signal S3 (shown in FIG. 4c) is a value that is below the supply potential at the supply potential terminal V1, by the amount of the inception voltage of the first diode D1. As a consequence of a positive edge of the control signal RINT up to 5 V, the pulse generator P generates a change of potential at its output $P_{OUT}$ from a first potential value of 0 V to a second potential value of 5 V, and after a delay which is caused by the first inverter I1, the second inverter I2, the third inverter I3 and the two delay capacitors Cap1, Cap2, back again to the first potential value of 0 V. As a result, there is a potential rise at the first electrode of the capacitor C from the first level P1 (4 V) of the third signal S3 to its second level P2 (6 V) and then back to the first level P1 (4 V). The second level P2 of the third signal S3 is limited by the second diode D2 to the value of the supply potential plus the inception voltage of the second diode D2.

FIG. 5a shows a further exemplary embodiment of the configuration A of FIG. 1 (wherein the transfer transistor T1 and the driver transistor T2 are of the n-channel type). Instead of the first diode D1 and the second diode D2 between the supply potential terminal V1 and the first electrode of the capacitor C, this embodiment has a p-channel switching transistor T3 with a substrate terminal that is connected to the first electrode of the capacitor C. In addition to that which is shown in FIG. 4a, the configuration A of FIG. 5a has a fifth inverter I5, a sixth inverter I6, a second NAND gate N2 and a seventh inverter I7, between the output of the third inverter I3 and the gate of the switching transistor T3. The input $P_{IN}$ of the pulse generator P is also connected to another input of the second NAND gate N2.

Figure 5B:
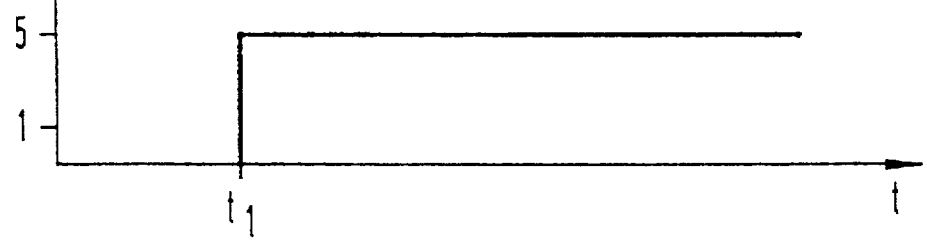
Figure 5C:
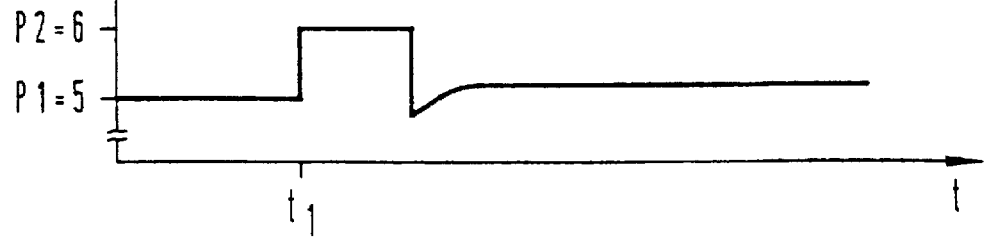

FIGS. 5b and 5c respectively show the courses of the control signal RINT and the third signal S3.

If the transfer transistor T1 and the driver transistor T2 of FIG. 1 are of the p-channel type, then the third signal S3, which then has a negative pulse (FIG. 3), can be generated with a similar configuration A to that of FIG. 5a. To that end, the switching transistor T3 must be of the n-channel type, and it must be possible to apply a supply potential of 0 V to the supply potential terminal V1.

I claim:

1. A bootstrap circuit, comprising:
   a transfer transistor and a driver transistor of the same channel type each having two channel terminals and a gate;
   a first signal terminal for receiving a first signal and a second signal terminal for receiving a second signal;
   one of the channel terminals of said transfer transistor being connected to the gate of said driver transistor;
   the other of the channel terminals of said transfer transistor being connected to said first signal terminal;
   one of the channel terminals of said driver transistor being connected to said second signal terminal;
   the other of the channel terminals of said driver transistor forming an output of the bootstrap circuit; and a configuration generating a pulsed third signal and having an output connected to the gate of said transfer transistor, said configuration including:

a pulse generator having an input for receiving a control signal and an output;

a capacitor having a first electrode to be precharged to a first level of the third signal, the first electrode being connected to the output of said configuration, and said capacitor having a second electrode connected to the output of said pulse generator;

said pulse generator receiving an edge of the control signal and generating a potential change at the output of said pulse generator from a first potential value to a second potential value and back to the first potential value, causing a potential shift to occur at the first electrode of said capacitor from the first level of the third signal to a second level of the third signal and back to the first level of the third signal;

a supply potential terminal, and a diode connected between said supply potential terminal and the first electrode of said capacitor, for precharging to the first level of the third signal; and another diode being connected between the first electrode of said capacitor and said supply potential terminal and being connected antiparallel to said first-mentioned diode, for limiting the second level of the third signal;

the second signal having an edge extending from a first level to a second level and beginning at a bootstrap time;

the first signal having a precharging level between the first level and the second level of the second signal occurring no later than another time being at the latest equal to the bootstrap time;

after the other time, the third signal having the first level being equal to or located on the other side of the level of the first signal as seen from the second level of the second signal; and before the other time, the third signal having the second level being on the same side of the precharging level of the first signal as seen from the second level of the second signal.

2. The bootstrap circuit according to claim 1, wherein before the other time, the level of the third signal differs from that of the first signal by at least the value of the inception voltage of the transfer transistor.

3. A bootstrap circuit, comprising:

a transfer transistor and a driver transistor of the same channel type each having two channel terminals and a gate;

a first signal terminal for receiving a first signal and a second signal terminal for receiving a second signal;

one of the channel terminals of said transfer transistor being connected to the gate of said driver transistor;

the other of the channel terminals of said transfer transistor being connected to said first signal terminal;

one of the channel terminals of said driver transistor being connected to said second signal terminal;

the other of the channel terminals of said driver transistor forming an output of the bootstrap circuit; and a configuration generating a pulsed third signal and having an output connected to the gate of said transfer transistor, said configuration including:

a pulse generator having an input for receiving a control signal and an output;

a capacitor having a first electrode to be precharged to a first level of the third signal, the first electrode being connected to the output of said configuration, and said capacitor having a second electrode connected to the output of said pulse generator;

said pulse generator receiving an edge of the control signal and generating a potential change at the output of said pulse generator from a first potential value to a second potential value and back to the first potential value, causing a potential shift to occur at the first electrode of said capacitor from the first level of the third signal to a second level of the third signal and back to the first level of the third signal;

a supply potential terminal, and a diode connected between said supply potential terminal and the first electrode of said capacitor, for precharging to the first level of the third signal; and another diode being connected between the first electrode of said capacitor and said supply potential terminal and being connected antiparallel to said first-mentioned diode, for limiting the second level of the third signal;

the second signal having an edge extending from a first level to a second level and beginning at a bootstrap time;

the first signal having a precharging level between the first level and the second level of the second signal occurring no later than another time being at the latest equal to the bootstrap time;

the first signal having a given edge before reaching the precharging level, and before the given edge of the first signal the third signal being located on the same side of the precharging level of the first signal as seen from the second level of the second signal;

after the other time, the first level of the third signal being equal to or located on the other side of the level of the first signal as seen from the second level of the second signal; and before the other time, the second level of the third signal being on the same side of the precharging level of the first signal as seen from the second level of the second signal and the level of the third signal differs from that of the first signal by at least the value of the inception voltage of the transfer transistor.

4. A bootstrap circuit, comprising:

a transfer transistor and a driver transistor of the same channel type each having two channel terminals and a gate;

a first signal terminal for receiving a first signal and a second signal terminal for receiving a second signal;

one of the channel terminals of said transfer transistor being connected to the gate of said driver transistor;

the other of the channel terminals of said transfer transistor being connected to said first signal terminal;

one of the channel terminals of said driver transistor being connected to said second signal terminal;

the other of the channel terminals of said driver transistor forming an output of the bootstrap circuit; and a configuration generating a pulsed third signal and having an output connected to the gate of said transfer transistor, said configuration including:

a pulse generator having an input for receiving a control signal and an output;

a capacitor having a first electrode to be precharged to a first level of the third signal, the first electrode being connected to the output of said configuration, and said capacitor having a second electrode connected to the output of said pulse generator;

said pulse generator receiving an edge of the control signal and generating a potential change at the output of said pulse generator from a first potential value to a second potential value and back to the first potential value, causing a potential shift to occur at the first electrode of said capacitor from the first level of the third signal to a second level of the third signal and back to the first level of the third signal;

a supply potential terminal;

a switching transistor having a channel path connected between the first electrode of said capacitor and said supply potential terminal for precharging to the first level of the third signal;

said switching transistor blocking substantially simultaneously upon application of the second potential value to the output of said pulse generator; and said switching transistor being opened again after a change back to the first potential value at the output of said pulse generator, plus a further delay;

the second signal having an edge extending from a first level to a second level and beginning at a bootstrap time;

the first signal having a precharging level between the first level and the second level of the second signal occurring no later than another time being at the latest equal to the bootstrap time;

after the other time, the first level of the third signal being equal to or located on the other side of the level of the first signal as seen from the second level of the second signal;

before the other time, the second level of the third signal being on the same side of the precharging level of the first signal as seen from the second level of the second signal.

5. A bootstrap circuit, comprising:

a transfer transistor and a driver transistor of the same channel type each having two channel terminals and a gate;

a first signal terminal for receiving a first signal and a second signal terminal for receiving a second signal;

one of the channel terminals of said transfer transistor being connected to the gate of said driver transistor;

the other of the channel terminals of said transfer transistor being connected to said first signal terminal;

one of the channel terminals of said driver transistor being connected to said second signal terminal;

the other of the channel terminals of said driver transistor forming an output of the bootstrap circuit;

a configuration generating a pulsed third signal and having an output connected to the gate of said transfer transistor, said configuration including:

a pulse generator having an input for receiving a control signal and an output;

a capacitor having a first electrode to be precharged to a first level of the third signal, the first electrode being connected to the output of said configuration, and said capacitor having a second electrode connected to the output of said pulse generator;

said pulse generator receiving an edge of the control signal and generating a potential change at the output of said pulse generator from a first potential value to a second potential value and back to the first potential value, causing a potential shift to occur at the first electrode of said capacitor from the first level of the third signal to a second level of the third signal and back to the first level of the third signal;

a supply potential terminal;

a switching transistor having a channel path connected between the first electrode of said capacitor and said supply potential terminal for precharging to the first level of the third signal;

said switching transistor blocking substantially simultaneously upon application of the second potential value to the output of said pulse generator; and said switching transistor being opened again after a change back to the first potential value at the output of said pulse generator, plus a further delay;

the second signal having an edge extending from a first level to a second level and beginning at a bootstrap time;

the first signal having a precharging level between the first level and the second level of the second signal occurring no later than another time being at the latest equal to the bootstrap time;

the first signal having a given edge before reaching the precharging level, and before the given edge of the first signal the third signal being located on the same side of the precharging level of the first signal as seen from the second level of the second signal;

after the other time, the first level of the third signal being equal to or located on the other side of the level of the first signal as seen from the second level of the second signal; and before the other time, the second level of the third signal being on the same side of the precharging level of the first signal as seen from the second level of the second signal and the level of the third signal differs from that of the first signal by at least the value of the inception voltage of the transfer transistor.

* * * * *